United States Patent [19]
Slavin et al.

[11] Patent Number: 5,926,022
[45] Date of Patent: Jul. 20, 1999

[54] METHOD FOR FLOW COMPENSATING A MULTI-SHOT ECHO-PLANAR MRI PULSE SEQUENCE

[75] Inventors: Glenn S. Slavin; Stephen J. Riederer, both of Rochester, Minn.

[73] Assignee: Mayo Foundation For Medical Education and Research, Rochester, Minn.

[21] Appl. No.: 08/838,554

[22] Filed: Apr. 9, 1997

[51] Int. Cl.$^6$ ................................................. G01V 3/175
[52] U.S. Cl. ..................... 324/309; 324/309; 324/300; 324/306; 324/313; 600/412
[58] Field of Search .................. 324/309, 300, 324/306, 313; 600/412

[56] References Cited

U.S. PATENT DOCUMENTS

| | | | |
|---|---|---|---|
| 4,731,583 | 3/1988 | Glover et al. | 324/309 |
| 5,280,244 | 1/1994 | Hinks | 324/309 |

OTHER PUBLICATIONS

Multi–planar Image Formation Using NMR Spin Echoes, Jour. of Phys, vol. 10, No. 3, p. L55–L58, P. Mansfield.
Echo–Planar MR Imaging, Radiology, Sep. 1994, vol. 192, No. 3, pp. 600–612, Edelman, et al.
Analysis of T2 Limitations and Off–Resonance Effects on Spatial Resolution and Artifacts in Echo–Planar Imaging, MRM 14, 123–139 (1990), Farzaneh, et al.
Echo–planar Imaging of the Liver with a Standard MR Imaging System, Radiology vol. 189, No. 1, Oct. 1993; 189:259–264, Butts, et al.
Ultrafast Interleaved Gradient–Echo–Planar Imaging on a Standard Scanner, MRM 30:609–616 (1993), McKinnon.
Theoretical Aspects of Motion Sensitivity and Compensation in Echo–planar Imaging, JMRI 1991, vol. 1, No. 6, pp. 643–650, Duerk, et al.
Analysis of Flow Effects in Echo–planar Imaging, JMRI 1992, vol. 2, No. 3, pp. 285–293, Butts, et al.
A Velocity k–Space Analysis of Flow Effects in Echo–planar and Spiral Imaging, MRM 33:549–556 (1995), Nishimura, et al.
Motion Artifact Suppression Technique (MAST) for MR Imaging, J Comput Assist Tomogr, vol. 11, No. 3, 1987, pp. 369–377, Pattany, et al.
Echo–Planar High–Resolution Flow Velocity Mapping, MRM 12, 316–327 (1989), pp. 316–327, Firmin, et al.
Flow Sensitivity and Flow Compensation in Instant Imaging, Weisskoff, et al.
Flow Effects in Interleaved Echo–planar and Spiral Imaging, Gatehouse, et al.
Echo–planar Imaging with Asymmetric Gradient Modulation and Inner–Volume Excitation, MRM 13, 162–169 (1990), Feinberg, et al.
Phase Errors in Multi–Shot Echo Planar Imaging, MRM 32:535–539 (1994) Feinberg, et al.
Flow Velocity Zeugmatographic Interlace for NMR Imaging in Humans, MRI, vol. 1, pp. 197–203, 1982, Moran.
NMR Even Echo Rephasing in Slow Laminar Flow, J Comput Assist Tomogr, vol. 8, No. 4, 1984, Waluch, et al.
Eliminating Flow Ghosts in Echo–Planar Imaging, Mag. Reson. Sys. Research Lab., Stanford Univ., Stanford CA, Luk Pat, et al.
Hybrid Imaging with Gradient–Recalled Sliding Echoes, SMRI 1989, 7th Annual Meeting, 70/407, Farzaneh, et al.

*Primary Examiner*—Louis Arana
*Assistant Examiner*—Brij B. Shrivastav
*Attorney, Agent, or Firm*—Quarles & Brady, LLP

[57] ABSTRACT

A bipolar, phase-encoding, pre-phaser pulse is employed in each shot of a multi-shot EPI pulse sequence to smooth the phase-encoding gradient first moment throughout the scan. The first moment of the pre-phaser pulse is calculated for each shot in the scan and is played out at the beginning of each shot after the RF excitation.

3 Claims, 4 Drawing Sheets

▲ NO PHASE CORRECTION
○ GRADIENT MOMENT SMOOTHING

○ WITHOUT SLIDING ECHOES
● WITH SLIDING ECHOES

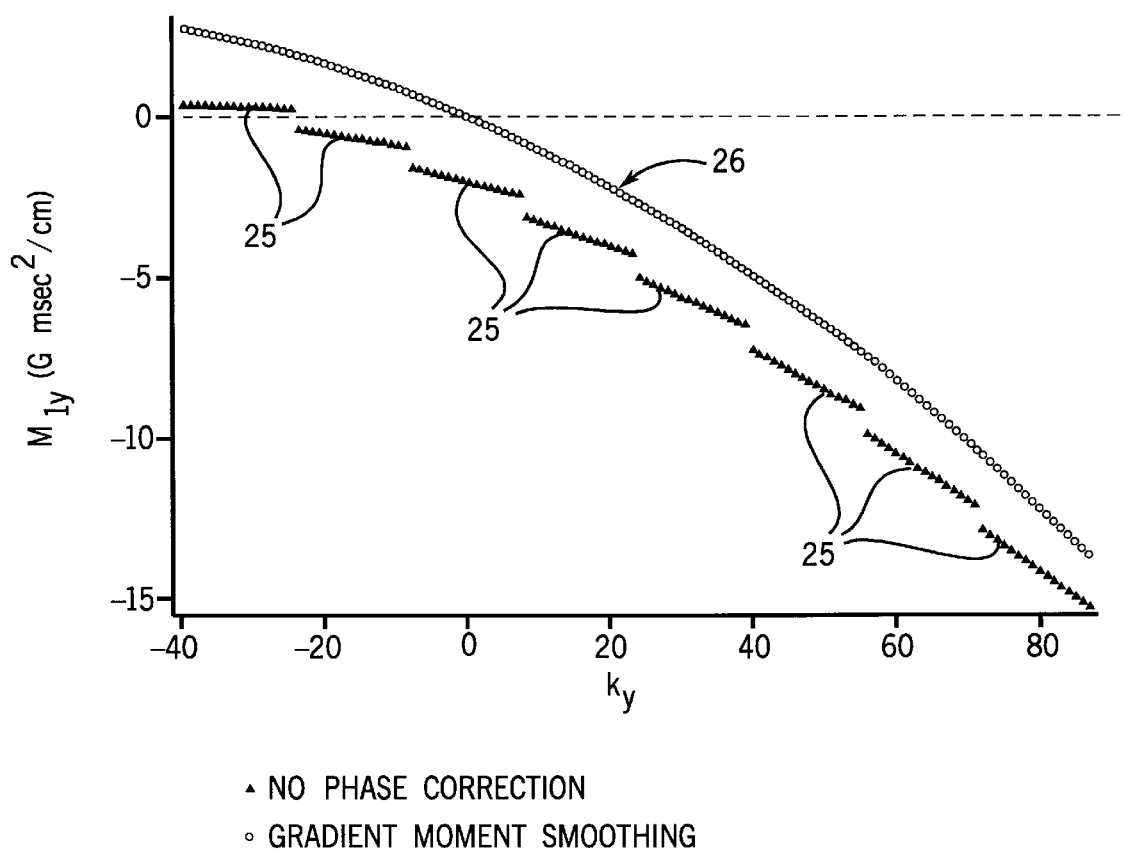

METHOD FOR FLOW COMPENSATING A MULTI-SHOT ECHO-PLANAR MRI PULSE SEQUENCE

STATEMENT REGARDING FEDERALLY SPONSORED RESEARCH

This invention was made with government support under grants 2 RO1 CA37933 and 2 RO1 HL37310 awarded by the National Institutes of Health to Mayo Foundation For Medical Education Research, and the United States Government has certain rights in this invention.

BACKGROUND OF THE INVENTION

The field of the invention is nuclear magnetic resonance imaging methods and systems. More particularly, the invention relates to the elimination of flow artifacts in MRI images, and particularly, the elimination of such artifacts in images acquired with echo-planar ("EPI") pulse sequences.

When a substance such as human tissue is subjected to a uniform magnetic field (polarizing field $B_0$), the individual magnetic moments of the spins in the tissue attempt to align with this polarizing field, but precess about it at their characteristic Larmor frequency. If the substance, or tissue, is subjected to a magnetic field (excitation field B1) which is in the x-y plane and which is near the Larmor frequency, the net aligned moment, $M_z$, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The concept of acquiring NMR image data in a short time period has been known since 1977 when the echo—planar pulse sequence was proposed by Peter Mansfield (J. Phys. C.10: L55–L58, 1977). In contrast to standard pulse sequences, the echo-planar pulse sequence produces a set of NMR signals for each RF excitation pulse. These NMR signals can be separately phase encoded so that an entire scan of 64 views, for example, can be acquired in a single pulse sequence of 20 to 100 milliseconds in duration. The advantages of echo-planar imaging ("EPI") are well-known, and there has been a long felt need for apparatus and methods which will enable EPI to be practiced in a clinical setting. Other echo-planar pulse sequences are disclosed in U.S. Pat. Nos. 4,678,996; 4,733,188; 4,716,369; 4,355,282; 4,588,948 and 4,752,735.

In recent years, echo-planar imaging (EPI) has found increased use in both vascular and non-vascular imaging. Although the short acquisition time of "single-shot" EPI essentially freezes motion, it is susceptible to off-resonance effects and resolution limitations. To reduce these effects, "multi-shot" versions of EPI have been developed. A common multi-shot implementation is interleaved EPI, where the phase-encoding views of one shot, which provide coarse k-space sampling, lie next to the views of the next shot. Although the off-resonance effects are typically less severe than in the single-shot case, other EPI-specific artifacts, such as those due to flow and motion, can be more severe and are complicated by the interleaved nature of the multi-shot acquisition. Potential velocity-induced artifacts, which include ghosting, misregistration, and signal loss resulting from the unique gradient waveforms and long period of data acquisition, make motion compensation particularly desirable.

The theoretical effects of moving or flowing spins on echo-planar acquisitions are well known. As opposed to conventional spin-warp imaging, in which in-plane constant-velocity flow causes correctable misregistration effects, EPI is prone to severe velocity-induced artifacts. As a result, artifact reduction techniques using first order gradient moment nulling have been proposed for both single-shot and multi-shot EPI (P. M. Pattany, J. J. Phillips, L. C. Chiu, J. D. Lipcamon, J. L. Duerk, J. M. McNally, and S. N. Mohapatra, Motion Artifact Suppression Technique (MAST) for MR Imaging. *J. Comput Assist Tomogr.* 11(3), 369–377 (1987); J. L. Duerk and O. P. Simonetti, Theoretical Aspects of Motion Sensitivity and Compensation in Echo-Planar Imaging. JMRI. 1(6), 643–650 (1991); D. N. Firmin, R. H. Klipstein, G. L. Hounsfield, M. P. Paley, and M. P. Longmore, Echo-Planar High-Resolution Flow Velocity Mapping. *Magn. Reson. Med.* 12, 316–327 (1989); R. M. Weisskoff, A. P. Crawley, and V. Wedeen. Flow Sensitivity and Flow Compensation in Instant Imaging. in SMRM. 1990. New York, NM: p. 398; D. G. Nishimura, P. Irarrazabal, and C. H. Meyer, A Velocity k-Space Analysis of Flow Effects in Echo-Planar and Spiral Imaging. Magn Reson Med. 33(4), 549–556 (1995); and K. Butts, S. J. Riederer, R. L. Ehman, J. P. Felmlee, and R. C. Grimm, Echo-Planar Imaging of the Liver with a Standard MR Imaging System. *Radiology.* 189(1), 259–264 (1993).

Gradient moment nulling in the slice-select direction (i.e., z axis in an axial scan) in EPI is independent of k-space trajectory and identical to that used in conventional 2DFT imagining. For flow along the frequency-encoding (x) direction, where velocity-induced phase oscillates between the even and odd echoes in a given shot, gradient moment nulling can not be achieved for all echoes. However, if a unipolar, or "flyback" readout is employed and data are acquired only during one polarity of the read out gradient, all echoes can be compensated as described in D. A. Feinberg, R. T. Turner, P. D. Jakab, and M. von Kienlin, Echo-Planar Imaging with Asymmetric Gradient Modulation and Inner-Volume Excitation. *Magn Reson Med.* 13, 162–169 (1990).

For flow components along the phase-encoding (y) direction, where velocity-induced phase accrues quadratically over the readout period, several gradient moment nulling techniques have been proposed. For single-shot EPI, methods have been proposed for flow compensating one particular echo, or flow compensating every echo, but at the cost of scanning efficiency for the latter. The only experimental method thus far reported for multi-shot EPI uses gradient moment nulling to zero the phase of the lowest k-space view of each shot. However, as will be explained below, this single-echo gradient moment nulling method does not fully address the complications introduced by the interleaved acquisition and as a result, significant flow-induced artifacts can persist.

In single-shot EPI, because all views are acquired sequentially after a single excitation, phase due to all sources accrues monotonically and continuously over the echo train and thus smoothly across $k_y$ sampling of k-space. This applies to linear (zeroth-order) phase due to inhomogeneity and susceptibility effects as well as to quadratic (first-order) phase due to constant-velocity flow or motion. In contrast, the non-sequential (interleaved) acquisition of views in multi-shot EPI disturbs this smooth phase evolution across $k_y$ sampling. Specifically, a multi-shot EPI scan produces a zeroth-order phase map that resembles a staircase, with the number of steps equal to the number of echoes per shot. Here we define the number of echoes per shot as the echo train length ("ETL"). The "sliding echoes" technique described by F. Farzaneh and S. J. Riederer, *Hybrid Imaging with Gradient-Recalled Sliding Echoes*. in 7th SMRI. 1989. p.70; and D. A. Feinberg and K. Oshio, Gradient-Echo Shifting in Fast MRI Techniques (GRASE Imaging) for Correction and Field Inhomogeneity Errors and Chemical Shift. *J. Magn. Reson.* 97, 177–183 (1992); linearizes this off-resonance phase by adding a cumulative time delay to the echo train waveform on successive shots. For imaging static objects, this is sufficient to remove the major ghosting artifacts due to the multi-shot acquisition. However, as will be described below, when imaging in the presence of flow or motion, discontinuities in the quadratic phase across $k_y$ sampling persist and cause artifacts.

SUMMARY OF THE INVENTION

The present invention is an improved multi-shot EPI pulse sequence in which the first moment of the phase encoding gradient is smoothed during the scan to reduce image artifacts caused by moving, or flowing spins along the phase-encoding axis. More specifically, a first moment correction is calculated for each shot in the multi-shot EPI pulse sequence and this first moment correction is used to control the first moment produced by a phase-encoding pre-phaser pulse that is played out at the beginning of each shot after the RF excitation of the spins to be imaged.

A general object of the invention is to reduce motion and flow artifacts in images acquired with multi-shot EPI pulse sequences. It has been discovered that in interleaved, multi-shot EPI, the evolution of flow-induced phase along $k_y$ is governed primarily by the phase accrual across the echo train. The phase of a spin is proportional to the first temporal moment of the gradients through which it moves, and the first moment is a quadratic function of time. Therefore, it is expected that the phase across $k_y$ will also increase quadratically with increased time. In single-shot EPI, this is exactly the case; in multi-shot EPI, it is not. The resulting discontinuities produce artifacts in the reconstructed images unless the spin phase is smoothed across $k_y$. The invention is a velocity-independent phase correction designed to smooth the discontinuous first moment curve into a true quadratic curve, thereby removing the ghost artifacts in the reconstructed image. Because the behavior of the first moment of the phase encoding gradient is effectively smoothed out across $k_y$ as a function of the phase encoding view, we call this technique "Gradient Moment Smoothing."

BRIEF DESCRIPTION OF THE DRAWING

FIG. 5 is a graphic illustration of the phase encoding gradient first moment during a multi-shot EPI scan with and without the present invention.

GENERAL DESCRIPTION OF THE INVENTION

The phase of a spin moving along the phase-encoding direction is dependent on its velocity $v_y$ and the strength, duration, and timing of the gradients through which it moves. The parameter which characterizes the properties of the gradient waveform is the first moment $M_{1y}$, defined as $$M_{1y}(t) = \int_0^t \tau G_y(\tau) d\tau, \qquad [1]$$

where the origin is the time of excitation and $G_y(\tau)$ is the amplitude of the time-varying phase-encoding gradient. The phase at time t is then given by $$\Phi_y(t) = \gamma v_y M_{1y}(t) \qquad [2]$$

Figure 3:
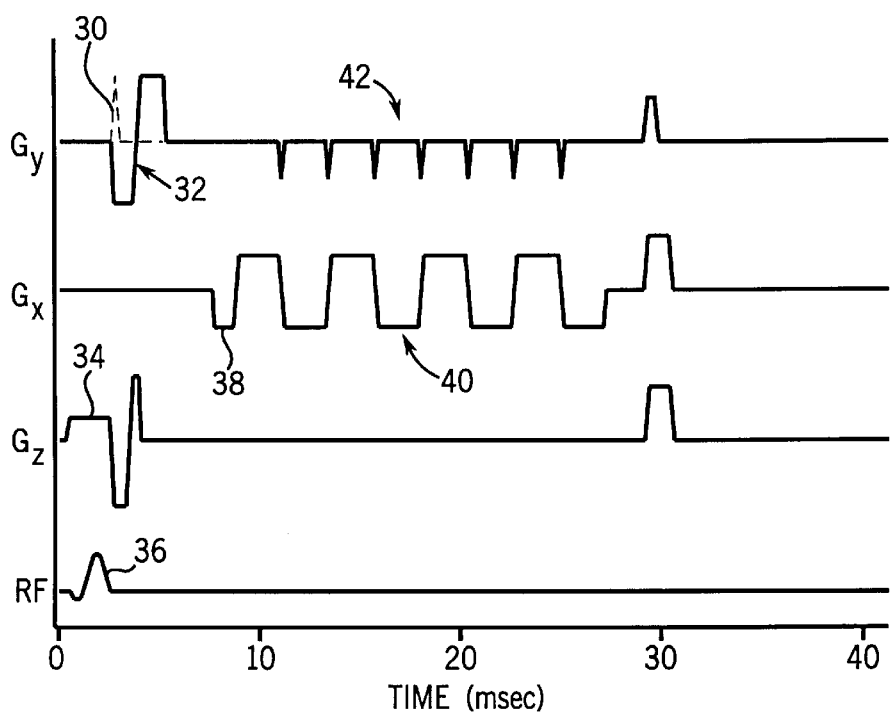
FIG. 3 is a graphic representation of an EPI pulse sequence which is adjusted to practice the present invention in the MRI system of FIG. 1.
Figure 4:
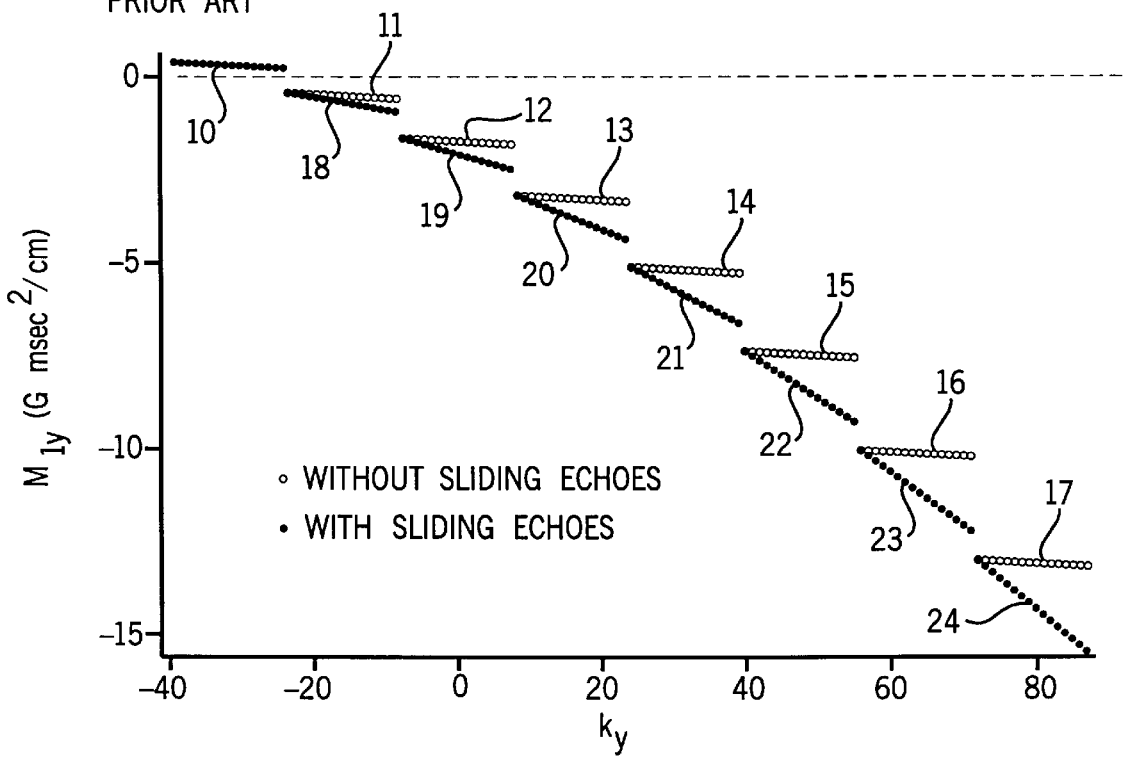
FIG. 4 is a graphic illustration of the phase encoding gradient first moment during a prior art multi-shot EPI scan.

The evolution of phase over the echo train is smooth in single-shot EPI, but it is not true in multi-shot EPI. FIG. 3 shows a multi-shot gradient-echo EPI pulse sequence to which the present invention is applied. FIG. 4 shows the calculated $M_{1y}$ curve for this sequence using 16 shots, and an ETL of 8. The 8 groups of 16 views shown at 10–17, indicate the calculated first moment $M_{1y}$ when sliding echoes are not used. Consider initially the first echo of each shot. The $G_y$-dependent first moment $M_{1y}$ of this echo depends only on the initial phase-encoding gradient (prephaser). In interleaved EPI, the amplitude of this prephaser changes linearly from shot to shot in order to initialize the first phase-encoding view of each shot. Therefore, because the first moment has a linear dependence on the amplitude of the prephaser, the first moment of the first echo also changes linearly from shot to shot. Consequently, as seen in FIG. 4, the first group 10 of views has linear phase. In fact, without sliding echoes the phase of all eight groups 10–17 displays the same slope. However, because $M_{1y}$ accumulation across the echo train is quadratic, the offset from zero of each group of echoes 10–17 changes quadratically. This produces a discontinuous quadratic "staircase" for the first-order phase that creates image artifacts in prior multi-shot EPI images.

To see how the first moment $M_{1y}$ changes from shot to shot when using an EPI pulse sequence with sliding echoes, consider again the first gradient-echo of each shot. Since there are no phase-encoding gradient blips prior to this echo, $M_{1y}$ for the first group of 16 views evolves linearly due to the prephaser and is identical to the group of non-sliding echoes 10. Next consider the subsequent gradient-echoes. If we model the phase-encoding gradient blips as rectangular pulses, the first moment $M_{1y}$ (k,n) at the kth gradient-echo of the nth shot is given by $$M_{1y}(k, n) = M_{1y}(1, n) + \frac{1}{2} G_b \sum_{i=0}^{k-2} [t_e^2 - t_s^2 + 2(i \cdot w + (n-1)\Delta)(t_e - t_s)] \qquad [3]$$

for $1 \leq n \leq N$ and $2 \leq k \leq ETL$, where $M_{1y}(1, n)$ is the first moment due to the prephaser on the nth shot, $G_b$ is the amplitude of the blip gradient, $t_s$ and $t_e$ are the start and end times of the first phase-encoding blip on the first shot, w is time between blips (i.e. the inter-echo time), $\Delta$ is the incremental slide-time of the echo trains, and N is the number of shots in the scan.

The slope of each group of views 10, 18–24 can be determined from equation [3] as $$\frac{dM_{1y}(k,n)}{dn} = \frac{dM_{1y}(l,n)}{dn} + (k-1)G_b\Delta(t_e - t_s) \quad [4]$$

and is linear with the gradient-echo number k. (Note that $dM_{1y}(1,n)/dn$ is constant for all k and n, as it simply represents the uniformly changing amplitude of the prephaser gradient from shot to shot.) Again, as in the non-sliding echoes case, each group has linear phase. In this case, however, as can be seen from equation [4] and FIG. 4, the use of sliding echoes causes the slope of each group 18–24 to change linearly across the echo train. Consequently, although the curve is better behaved, the discontinuous regions remain, and their presence in an otherwise quadratic curve is a source of ghosting due to flow or motion in the phase-encoding direction.

The present invention is a velocity-independent phase correction which removes both the discontinuities and the offset from zero at TE of the first moment $M_{1y}$ due to the phase encoding gradient $G_y$. As shown in FIG. 5, the technique, which can be termed gradient moment smoothing (GMS), converts the first moment behavior from a discontinuous set of linear segments 25 to the desired continuous quadratic curve 26. This is accomplished by calculating a first moment correction for each shot of the multi-shot EPI scan as follows:

1. Equation [3] is used first to numerically generate the actual first moments of the phase-encoding gradient of each echo in the N/2th shot;
2. Equation [3] is then used to generate the actual first moments of the phase encoding gradient for the lowest phase-encoded echo (i.e. the echo on which TE occurs) for all the shots;
3. Modified first moments of the echoes in step 2 are found by quadratic interpolation of the curve defined by the first moments calculated in Step 1;
4. The offset from zero first moment at $k_y=0$ is similarly interpolated and subtracted from the modified first moments in step 3; and
5. The actual first moments (step 2) are subtracted from the zero-offset quadratically-interpolated first moments (step 4) to give a quadratic, shot-dependent array of first moment corrections. These corrections are added to the first moments produced by the original prephaser.

In the above discussion the specific shot to use in step 1 and the specific shot to use in step 2 are arbitrary. Values different from the specific ones indicated can also be used.

The correction array is stored and used during the scan to adjust the first moment of the phase-encoding prephaser in each shot. As shown in FIG. 3, this is accomplished by replacing the conventional trapezoidal or sinusoidal prephaser pulse 30 with a bipolar phase-encoding pulse 32. With each shot, the amplitude of the bipolar prephaser 32 is changed to provide the desired first moment plus the adjustment indicated in the correction array, while maintaining the appropriate phase-encoding area, or zeroth moment. Constraining the first moment of one group of echoes to lie on the quadratic curve defined by the phase-encoding blips of one echo train ensures that the remaining groups will also lie on that curve because the equation for this curve is identical, except for the constant term, for all echo trains. The constant term reflects the action of the bipolar prephaser which simply applies the necessary offset for each echo train. The interpolation algorithm and calculation of the correction array are executed only once during waveform generation before the sequence begins.

DESCRIPTION OF THE PREFERRED EMBODIMENT

Figure 1:
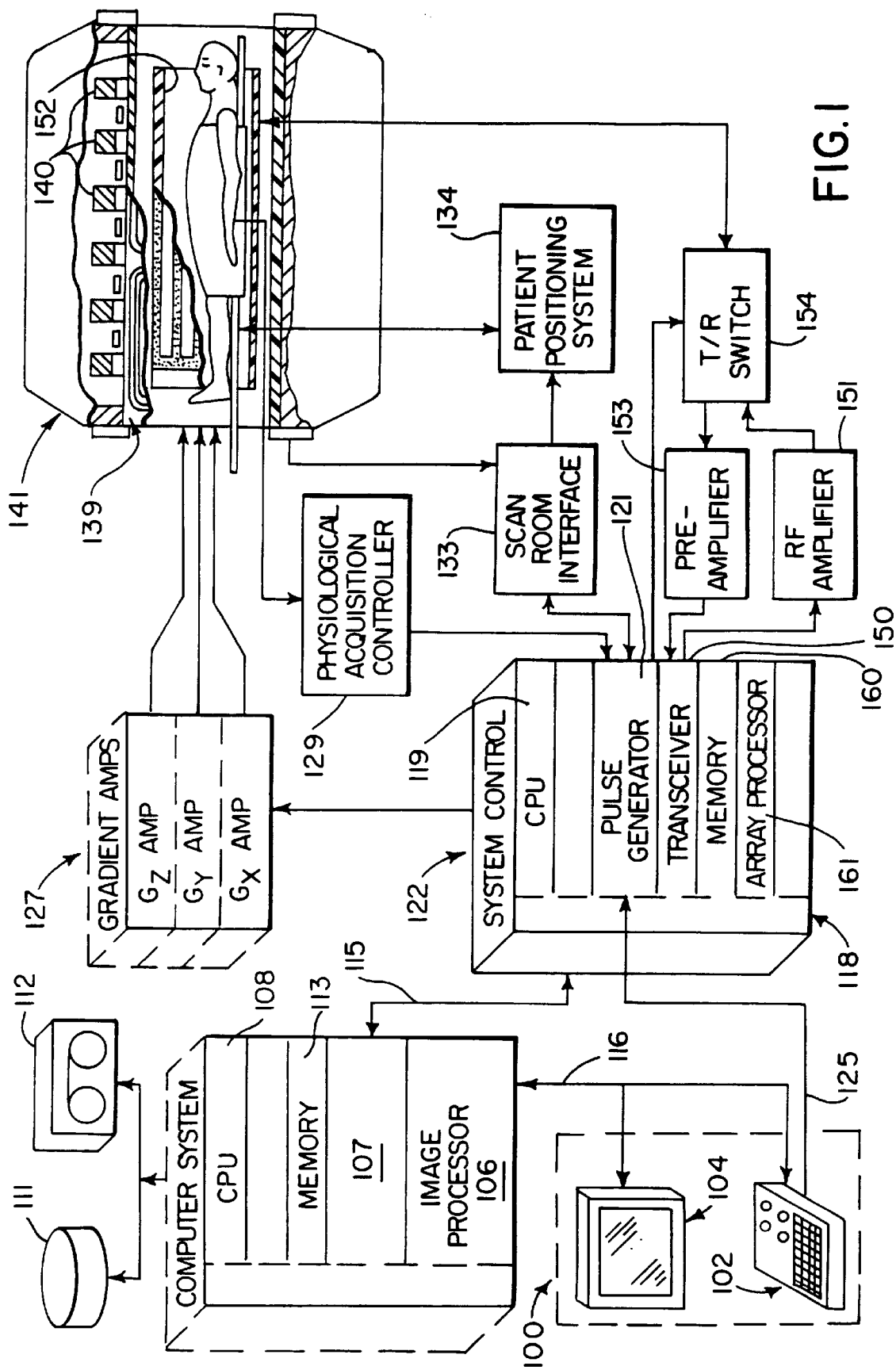
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
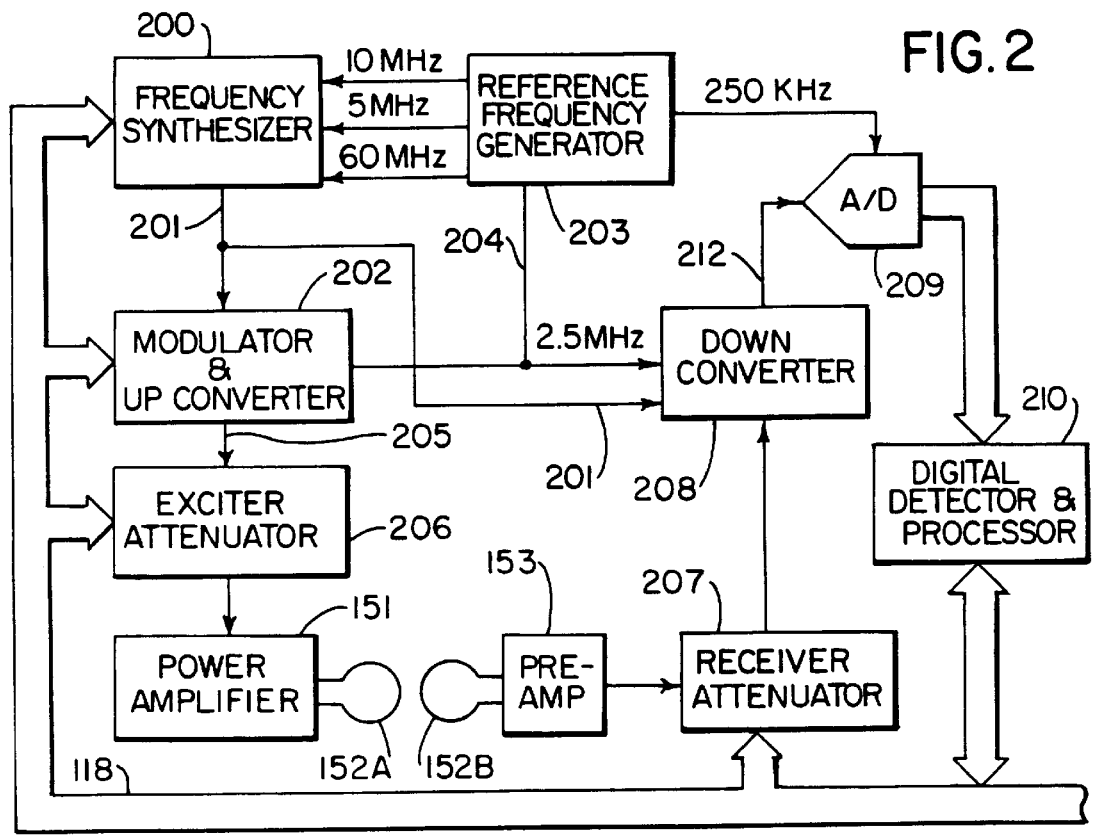
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Patent No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 20 which samples and digitizes the analog signal and applies it to a digital detector and signal processor 210 which produces 16-bit in-phase (I) values and 16bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Referring particularly to FIG. 3, the preferred multi-shot EPI pulse sequence used to practice the present invention employs a $G_z$ slice selection gradient pulse 34 in combination with a selective rf excitation pulse 36 to excite spins in an axial slice. The $G_y$ bipolar pre-phaser gradient waveform 32 is then applied, and a $G_x$ pre-phaser pulse 38 followed by an alternating readout gradient pulse train 40 is then applied. A gradient-recalled NMR echo signal is acquired during each positive and negative top of the readout pulse train 40 and a phase-encoding gradient "blip" 42 is applied between each readout to separately phase encode each acquired echo signal, or view. The sequence was implemented with 2.2 G/cm peak gradient amplitudes and 184 ms rise time from zero to full scale. All scans used 16 shots with an ETL of eight to acquire a 256×128 matrix at a bandwidth of 125 kHz. Axial images were acquired with a 24 cm field of view (FOV) with phase encoding in the anterior-posterior direction. The total readout duration for the eight echoes was 18.4 ms. The TE/TR was 14/100 msec with TE, defined as the effective time at which the ky=0 view is sampled, occurring on the third gradient-echo of each shot. Other parameters included: 30° flip angle, 10 mm slice thickness, and gradient moment nulling in the $G_z$ slice-select direction. With eight dummy repetitions used to set the spins to steady state, the scan time was 2.4 s.

This pulse sequence is downloaded to the pulse generator 121 (FIG. 1) and a value from the correction array described above is also downloaded and used to control the amplitude of the bipolar pre-phaser gradient 32. Eight separate views are acquired with each EPI pulse sequence and then another value is downloaded from the stored correction array and the EPI pulse sequence is repeated. This sequence repeats until sixteen EPI shots have been performed to complete the scan.

It should be apparent to those skilled in the art that many variations are possible from the above-described preferred embodiment. For example, the invention may be applied to a "flyback" EPI pulse sequence and the selected slice may be oriented in any direction by proper rotation of the phase-encoding, readout and slice selection gradient fields.

We claim:

1. A method for reducing artifacts in an image caused by movement of spins along a phase encoding direction during the acquisition of NMR data using a multi-shot EPI pulse sequence, the steps comprising:
   a) calculating a first moment correction for each shot of the multi-shot EPI pulse sequence;
   b) producing an RF excitation pulse to produce transverse magnetization;
   c) producing a pre-phaser gradient pulse to produce a magnetic field gradient along the phase encoding direction having a desired value plus a calculated first moment correction;
   d) producing a readout magnetic field gradient which alternates in value to produce a series of NMR echo signals;
   e) producing a phase encoding gradient pulse between each NMR echo signal in said series to separately phase encode the NMR echo signals;

f) acquiring each NMR echo signal;

g) repeating steps b) through f) to acquire the NMR echo signals in each shot of the multi-shot EPI pulse sequence, wherein the corresponding calculated first moment correction is used in each shot; and h) reconstructing an image using the acquired NMR echo signals.

2. The method as recited in claim 1 in which the pre-phaser gradient pulse is bipolar.

3. The method as recited in claim 2 in which the amplitude of the bipolar pre-phaser gradient pulse is changed to produce the calculated first moment correction.

* * * * *